United States Patent [19]

Chung et al.

[11] Patent Number: 5,633,887
[45] Date of Patent: May 27, 1997

[54] OPTICAL DEVICES USING AN EXTERNAL CAVITY SEMICONDUCTOR LASER

[75] Inventors: Russell W. Chung, San Diego, Calif.; Robert J. Weber, Boone, Iowa

[73] Assignee: Iowa State University Research Foundation, Inc., Iowa

[21] Appl. No.: 334,193

[22] Filed: Nov. 4, 1994

[51] Int. Cl.$^6$ .................................................. H01S 3/10
[52] U.S. Cl. .................. 372/92; 372/26; 372/99; 372/108
[58] Field of Search .................. 372/92, 26, 70, 372/71, 99, 101, 108; 359/344

[56] References Cited

U.S. PATENT DOCUMENTS

| | | | |
|---|---|---|---|
| 5,442,651 | 8/1995 | Maeda | 372/97 |
| 5,499,261 | 3/1996 | Welch et al. | 372/50 |

*Primary Examiner*—James W. Davie
*Attorney, Agent, or Firm*—Flehr Hohbach Test Albritton & Herbert LLP

[57] ABSTRACT

A dual-mode optical device selectively operative in signal generation and amplification modes is disclosed herein. The dual-mode device includes a body of semiconductor material having opposed from and rear facets. During operation in the amplification mode, light is input through the front facet and is amplified within the body of the optical gain material. An at least partially optically reflective surface is positioned a first predetermined distance from one of the facets during operation of the device in the amplification mode. In the signal generation mode, the at least partially optically reflective surface is positioned a second predetermined distance from the one facet so as to induce optical oscillation within the body of semiconductor material. In a preferred implementation, a semiconductor diode laser having opposed first and second facets is utilized as an optical source. An at least partially optically reflective surface is positioned a predetermined distance from one of the first and second facets in order that a resonant cavity is formed therebetween. The predetermined distance between the at least partially optically reflective surface and the one facet may be modulated, thereby allowing modulation of optical output produced by the semiconductor diode laser.

27 Claims, 6 Drawing Sheets

OPTICAL DEVICES USING AN EXTERNAL CAVITY SEMICONDUCTOR LASER

The present invention relates generally to optical devices incorporating semiconductor lasers, and more particularly to an external cavity diode laser configured as a traveling wave amplifier or as a dual-mode optical amplifier-oscillator device.

BACKGROUND OF THE INVENTION

Typically, the elements within conventional optical communication systems are designed to perform only a single function. That is, optical source components are not disposed to be used interchangeably used as in-line amplifiers and optical sources, and vice-versa. Once an optical signal has been produced by an optical source, the signal is typically coupled into the fiber optic network using a conventional lens arrangement. Within the network, separate doped fiber or other semiconductor laser devices may then be used as in-line amplifiers to maintain a requisite level of optical signal power.

Considering a specific example, a conventional optical source component may include a semiconductor laser diode having an output facet optically coupled to a discrete optical power amplifier. The diode and amplifier may be formed together on a single crystal, and are maintained in optical alignment using various techniques. Unfortunately, the laser diode and light amplification elements are so configured so as to be capable of serving only as a source of optical energy. That is, the individual elements comprising the optical source are not designed to be decoupled in order to make possible the performance of a separate signal amplification function.

Research efforts have thus far been directed to improving the performance characteristics of the discrete optical source and amplification elements included within existing communication systems. Typically, efforts have concentrated upon enhancing emission wavelength stability, spectral purity, and modulation speed. Unfortunately, little progress appears to have been made in devising optical devices capable of performing more than a single function. It is believed that an optical device configured to perform, for example, both signal generation and amplification operations, would facilitate new network architectures for optical communication systems and would further lead to novel device applications.

Several obstacles have thus far precluded development of, for example, semiconductor laser devices capable of operating both as an amplifier and as a signal source. As is well known, when the reflectivity of both facets of a semiconductor diode laser are suppressed, a single-pass or "traveling-wave" amplifier (TWA) is formed. The required suppression of facet reflectivity is typically performed by applying an anti-reflection (AR) coating on each laser facet. However, the application of such an anti-reflection coating to the laser facets permanently renders the laser device incapable of operating as an optical source. Hence, semiconductor diode lasers have been configured to perform exclusively either signal generation or amplification functions.

Moreover, reducing facet reflectivity using AR coatings generally requires that precise control be maintained over both the refractive index and coating thickness. For example, control of coating thickness to within a few nanometers is generally required to achieve optimal performance. In addition, it has been determined that different ideal coating thicknesses exist for TE and TM mode operation of TWA devices. This finding has further complicated the problem of fabricating a TWA by using AR coating techniques to reduce facet reflectivity. Accordingly, it would be desirable to provide a semiconductor laser TWA not reliant upon an AR coating for facet reflectivity reduction.

Research efforts within the field of optical communications have also focused upon the development of diode laser transmitters for providing a modulated optical signal to a fiber optic communications network. Both the intensity and the emission wavelength of the diode laser may be modulated by varying the applied current. For example, digital coding of an optical input signal may be achieved by alternately turning the laser diode current on and off. However, such current modulation techniques may be unable to provide the modulation speed required for high capacity fiber optic networks. As a consequence, other techniques of high-speed optical modulation using external modulators have been investigated. Unfortunately, the size and temperature sensitivity of external modulators may render these devices inappropriate for certain fiber optic network applications. Accordingly, it would be desirable to provide a compact optical source capable of producing a high-speed modulated optical output signal.

OBJECTS OF THE INVENTION

Accordingly, one object of the present invention is to provide a compact optical source inherently capable of high-speed optical modulation.

It is another object of the present invention to provide a dual-mode device operative both as an optical amplifier and optical signal source.

It is yet another object of the present invention that the dual-mode device be inherently capable of high-speed optical modulation.

It is yet a further object of the invention to provide a semiconductor laser amplifier capable of being implemented without using AR coatings to reduce facet reflectivity.

SUMMARY OF THE INVENTION

These and other objects have been met with an optical device structure in which is incorporated a semiconductor laser coupled to a short external resonant cavity. By adjusting the length of the cavity so as to effectively modify the facet reflectivity of the laser, the device is selectively made to operate in either an amplification or signal generation mode. Moreover, modulation of the optical output produced by the device is achieved through corresponding modulation of the length of resonant cavity.

In one embodiment, the present invention comprises a dual-mode optical device selectively operative in signal generation and amplification modes. The dual-mode device includes a body of semiconductor material capable of providing optical gain, and having opposed front and rear facets. During operation in the amplification mode, light is input through the front facet and is amplified within the body of the optical gain material.

An at least partially optically reflective surface is positioned a first predetermined distance from one of the facets during operation of the device in the amplification mode. In the signal generation mode, the at least partially optically reflective surface is positioned a second predetermined distance from the one facet so as to induce optical oscillation within said body of semiconductor material during operation in a signal generation mode.

In another aspect, the invention comprises an optical source in which is included a semiconductor diode laser having opposed first and second facets. An at least partially optically reflective surface is positioned a predetermined distance from one of the first and second facets in order that a resonant cavity is formed therebetween. The predetermined distance between the at least partially optically reflective surface and the one facet is modulated, which in turn results in modulation of optical output produced by the semiconductor diode laser.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1A:
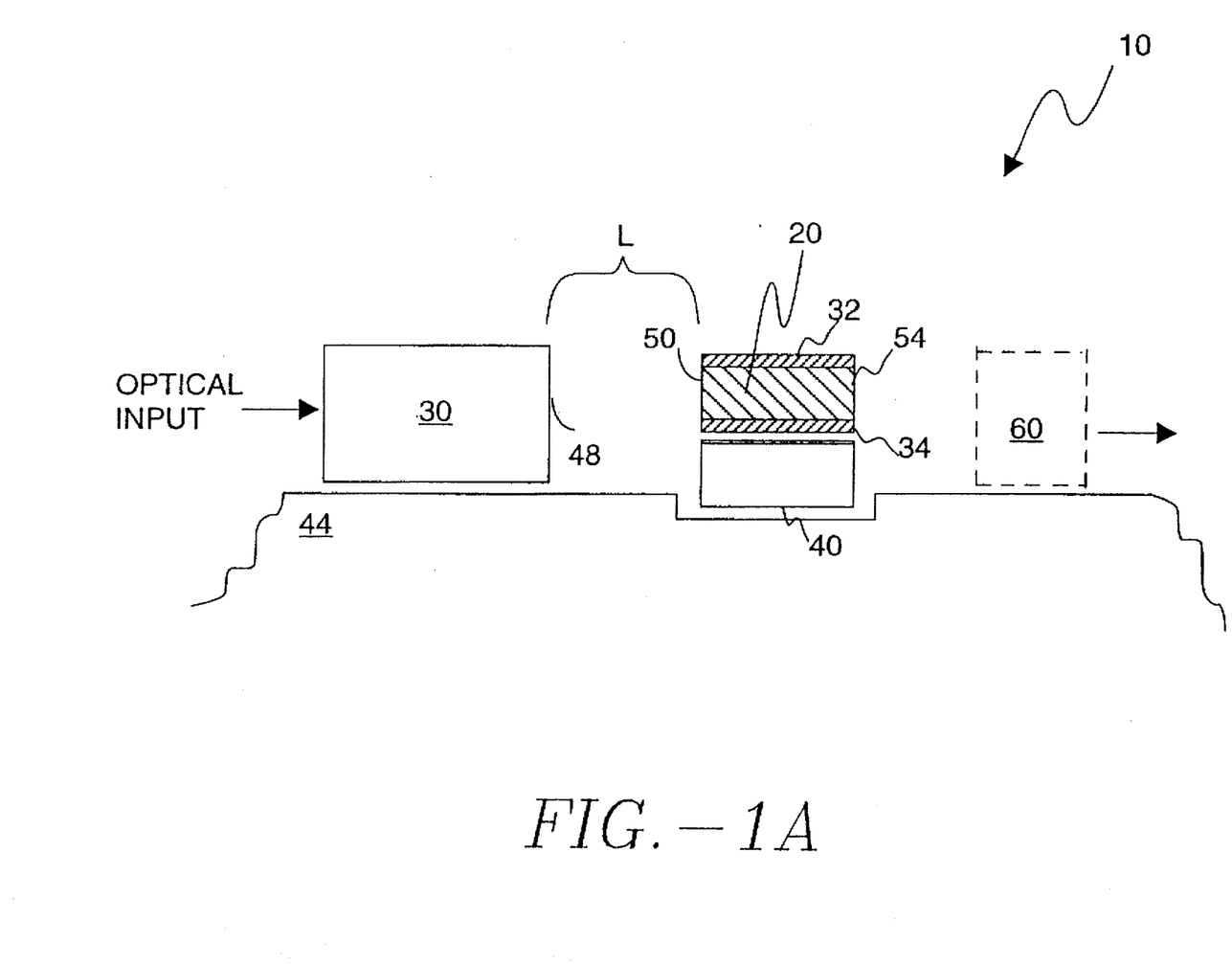
FIG. 1A provides a simplified side view of a semiconductor optical amplifier in accordance with the invention.

FIG. 1A provides a simplified side view of a semiconductor optical amplifier 10 in accordance with the invention. A body of semiconductor material 20 capable of providing optical gain, such as a semiconductor laser diode, is seen to be positioned in optical alignment with an input rod lens 30. In the embodiment of FIG. 1A the body of semiconductor material 20 comprises an AlGas, InCaAsP, or other diode laser of similar type. The amplifier 10 also includes a pair of electrically conductive contacts 32 and 34 on respective surfaces of the laser diode 20. A heat sink 40 is interposed between the laser diode 20 and a substrate 44, upon which is also mounted the rod lens 30.

Referring to FIG. 1A, a resonant cavity of length L external to the diode laser 20 is formed by a rod lens surface 48 and a front facet 50 of the diode laser. In accordance with the invention, the resonant cavity effectively reduces the reflectivity of front facet 50, thereby suppressing optical oscillation within the laser diode 20. This results in the diode laser 20 operating as a travelling wave amplifier, thereby allowing amplification of optical input coupled to the diode laser 20 through rod lens 30. Alternately, a resonant cavity may be formed between the rear facet 54 and a surface 58 of an output lens 60 (shown in phantom). In this instance the reflectivity of rear facet 54 is reduced, which leads to the requisite suppression of optical oscillation within the diode laser 20. Although an anti-reflection (AR) coating may be deposited on the front 50 and/or rear facet 54 in order to, for example, decrease the tolerance of the coupling distance between the rod lens and front facet 50, the presence of such an AR coating is not required for oscillation suppression.

Figure 1B:
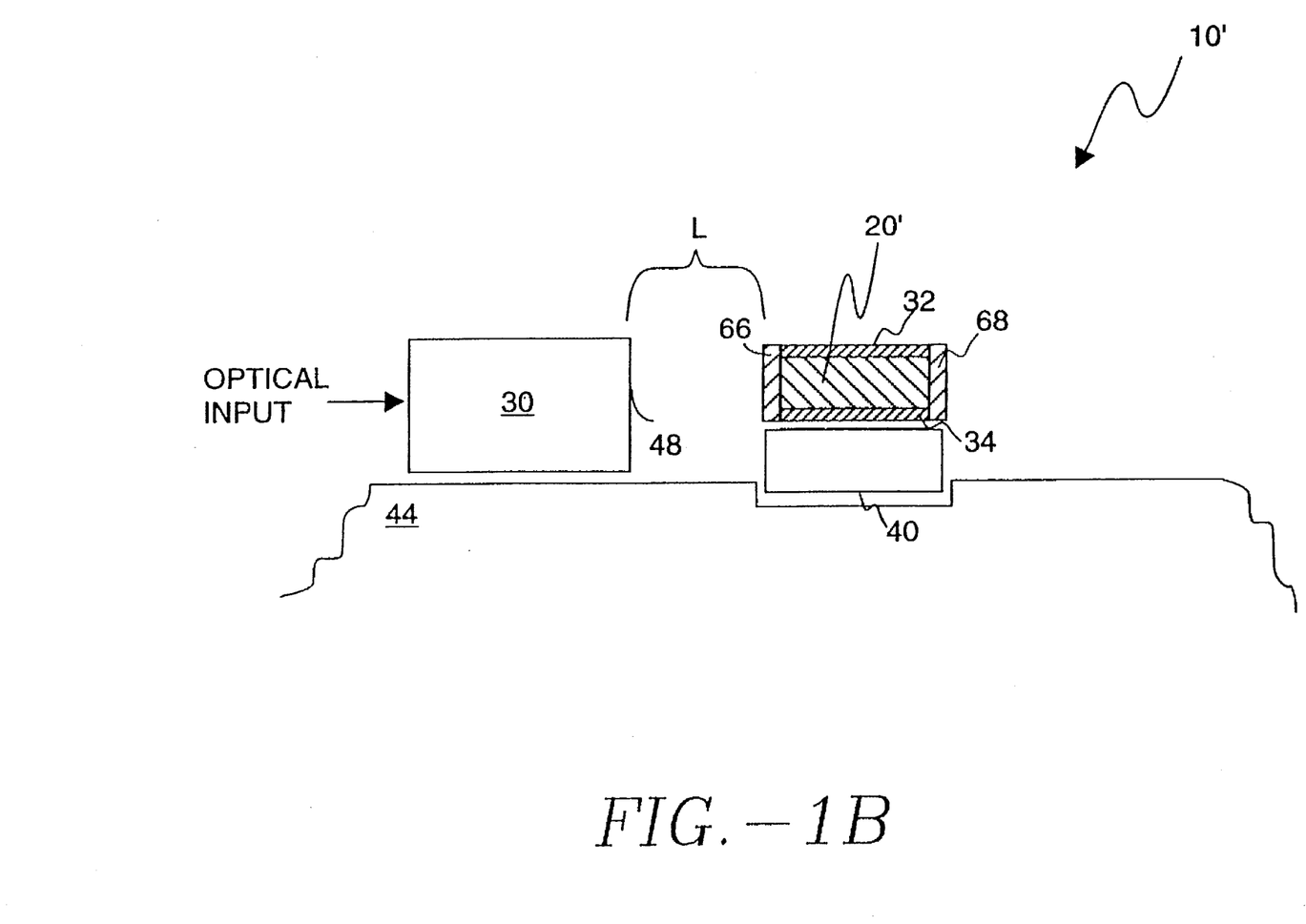
FIG. 1B shows a simplified side view of a semiconductor optical amplifier of the invention in which is incorporated a laser diode having front and rear anti-reflection coated facets.

FIG. 1B shows a simplified side view of a semiconductor optical amplifier 10' in which is incorporated a semiconductor laser diode 20', the front and rear facets of which are respectively coated with AR coatings 66 and 68. Given the substantial similarity between the amplifiers 10 and 10', like reference numerals have been used to identify like amplifier components. The AR coatings 66 and 68 may each be realized using a single or multiple layer non-reflection film of the type known to those skilled in the art.

Figure 2:
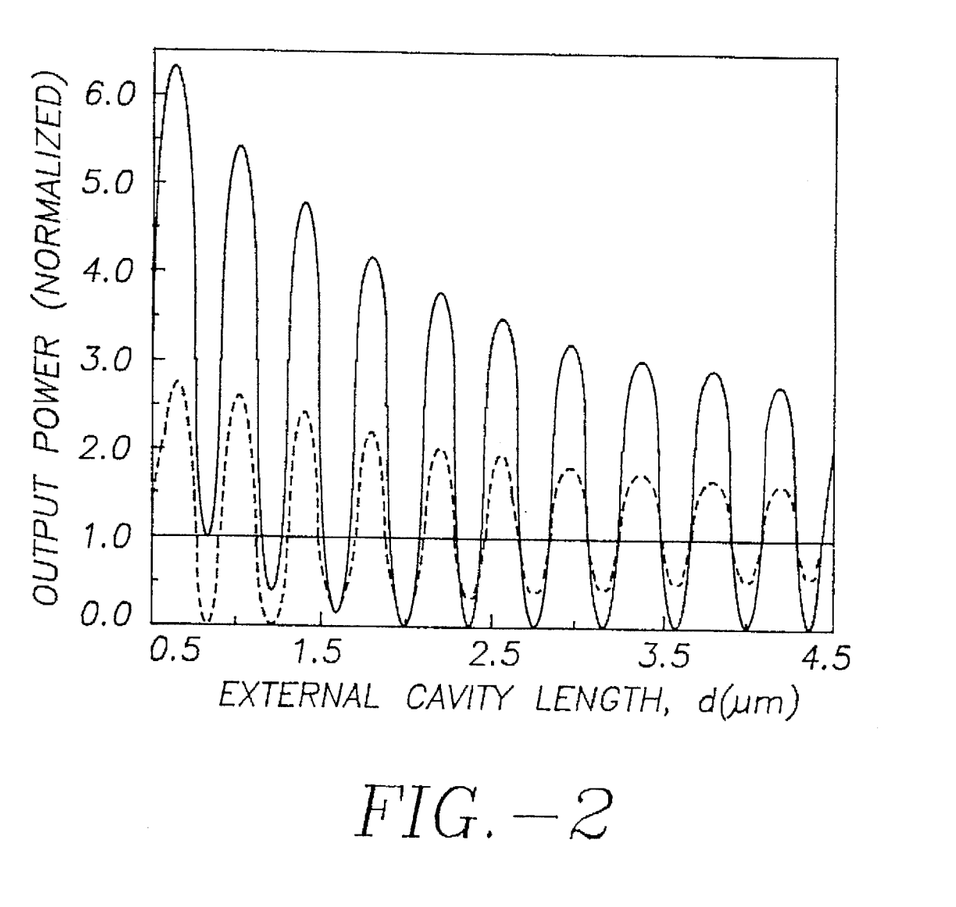
FIG. 2 shows a graphical representation of the normalized output power of an optical device of the invention as function of the length of an external remnant cavity.

Turning now to FIG. 2, a graphical representation is provided of normalized output power of the semiconductor diode laser 20 as function of the remnant cavity length L. The solid line trace of FIG. 2 represents output power variation using a 99% reflective gold-plated mirror (i.e., corresponding to a 99% reflective rod lens surface 48), while the dashed line trace represents the output power fluctuation produced with a 4% reflective lens surface. The peaks of the traces within FIG. 2 are indicative of those cavity lengths L resulting in the creation of a resonance condition, which effectively increase the reflectivity of the front laser facet. Similarly, the troughs within the traces of FIG. 2 correspond to those cavity lengths which minimize the effective reflectivity of the front laser facet. Since the lasing threshold of the diode laser 20 at a given level of applied bias is a function of facet reflectivity, output power is modulated as a function of the cavity length L. In order to increase the dynamic range over which optical output power may be modulated, the cavity length L will generally be selected to be less than the wavelength of the optical output of the laser 20.

In an exemplary embodiment of the amplifier 10 the rod lens 48 is positioned so as to minimize the effective reflectivity of the front laser facet. This is equivalent to adjusting the cavity length L to a position which prevents optical oscillation within the laser diode 20, which desirably prevents the amplifier 10 from producing output optical power in the absence of application of an optical input signal to the rod lens 48. The optical gain of the resultant travelling wave amplifier is then controlled through adjustment of the bias applied to the electrodes 32 and 34. In the specific case of a 4% reflector, the effective facet reflectivity is desirably reduced to the largest extent possible by selecting a cavity length L of less than 1μm (e.g., L=L₁). The cavity length will typically be selected such that facet reflectivity is minimized, and lasing threshold maximized, as a means of increasing the range of bias values over which the laser operates as an amplifier rather than as an oscillator.

Figure 3:
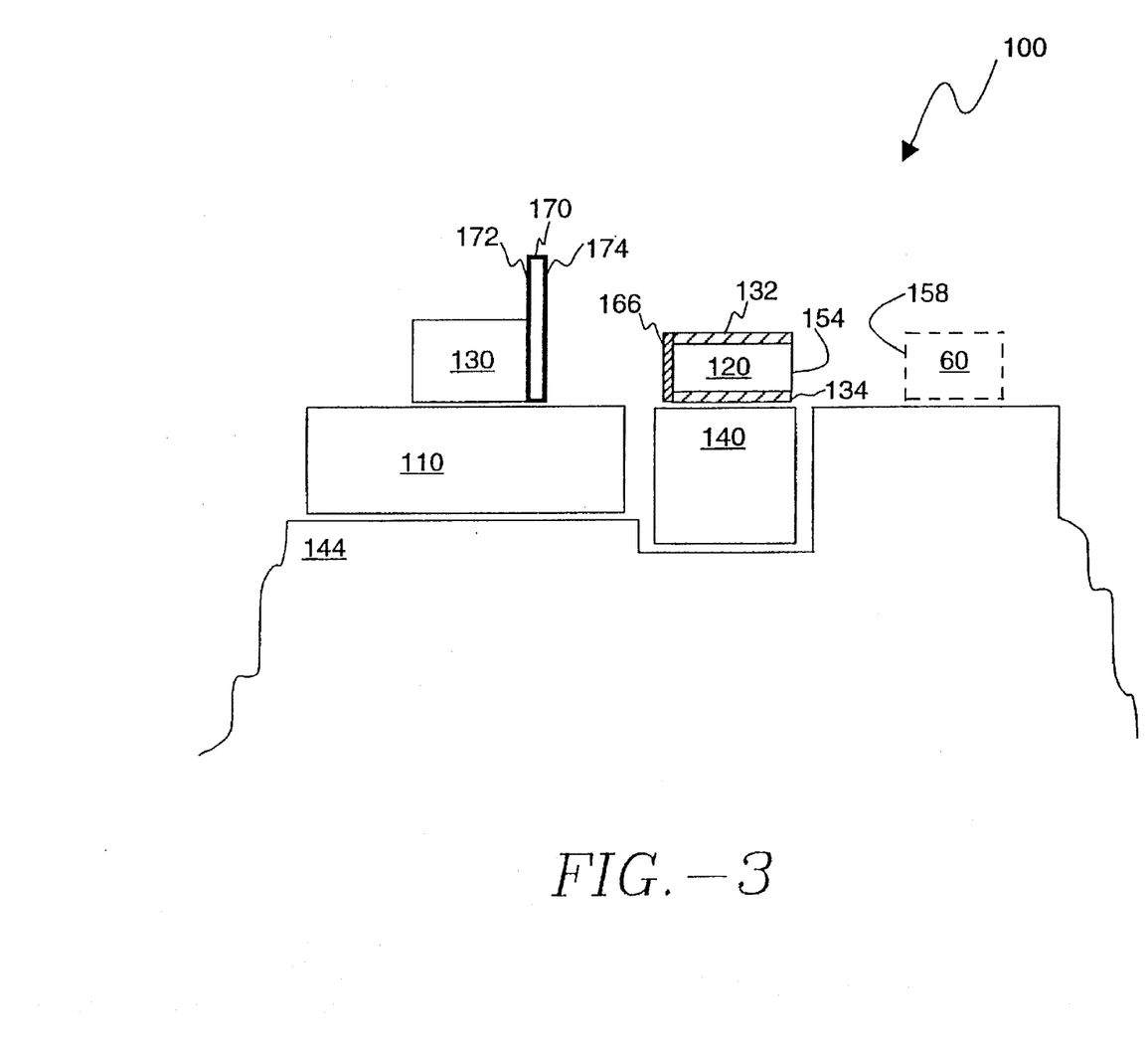
FIG. 3 is a block diagram of a dual-mode optical amplifier-oscillator in accordance with the invention.

FIG. 3 is a block diagram of a dual-mode optical amplifier-oscillator 100 in accordance with the invention. As is described below, the amplifier-oscillator includes a piezoelectric actuator 110 for modifying the length of a resonant cavity external to a semiconductor diode laser 120. This cavity length modification induces a corresponding change in facet reflectivity, which results in a transition between amplification or signal generation modes of operation of the amplifier-oscillator 100.

More specifically, during operation in an amplification mode an input signal is applied to a rod lens 130. The piezoelectric actuator 110 positions the rod lens 130 relative to the front facet of laser diode 120 such that the resonant cavity therebetween is of a first predetermined length. The first predetermined cavity length is selected (FIG. 2) to be one which causes a substantial reduction in the effective reflectivity of the front facet, thereby suppressing optical oscillation within the laser diode 120 during. When it is desired to switch to a signal generation (i.e., oscillation) mode, the piezoelectric actuator 110 translates the position of the rod lens such that a resonant cavity of a second predetermined length is created external to the laser diode. This second cavity length effectively increases the reflectivity of the front facet at least to the extent required to induce optical oscillation within the laser diode 120.

Referring again to FIG. 3, the amplifier-oscillator 100 further includes a thin-film resonator (TFR) 122 disposed to impart high-frequency modulation upon the optical output produced during the signal generation mode. The TFR 122 serves to modulate the reflectivity of the front facet of the laser diode 120, which results in a corresponding modulation of the optical output produced thereby. The TFR 122 may be used to effect amplitude modulation of the laser diode output, and may also be employed to modulate the lasing wavelength and phase of the diode laser 120. In an exemplary embodiment, appreciable amplitude modulation of the laser diode output has been found to occur at the resonant frequency of the TFR 122. It has also been found that the magnitude of the excitation voltage applied to the TFR 122 is related to the magnitude of the amplitude modulation impressed upon the laser diode output.

As is indicated by FIG. 3, the TFR 122 includes a piezoelectric active layer 170 sandwiched between front and rear optically transparent electrodes 172 and 174. In operation, high-frequency modulation of the thickness of the piezoelectric layer 170 is achieved by modulating the potential between the electrodes 172 and 174. It has been found that piezoelectric resonance at approximately 1 GHz may be obtained using a piezoelectric layer having a thickness of about 5 µm. It is anticipated that application of an AR coating 166 to the front laser facet will allow the TFR 122 to modulate the optical output produced by the laser diode 120 at much higher frequencies (e.g., 10 GHz).

The piezoelectric active layer 170 may be realized using, for example, either a zinc oxide (ZnO) or an aluminum nitride (AlN) film. The electrode 172 of the TFR 122 will typically be secured to the partially reflective (e.g., 4% reflective) surface of the rod lens 130 by, for example, conductive epoxy. In an exemplary embodiment the TFR 122 is dimensioned to define a surface, perpendicular to the plane of FIG. 3, on the order of 400 µm².

The TFR 122 may be realized using standard microelectronic fabrication techniques. In particular, the electrode 172 (e.g., gold) is deposited by way of any one of a number of conventional deposition techniques (e.g., evaporation, electron beam heating, or sputtering). The piezoelectric layer 170 may then be deposited on electrode 172 using DC magnetron sputtering in the presence of a nitrogen plasma. This sputtering technique results in "c-axis" oriented piezoelectric layers, although the resultant layer 170 will appear as polycrystalline in the directions transverse to the longitudinal c-axis.

Referring again to FIG. 3, the amplifier 1130 also includes a pair of electrically conductive contacts 132 and 134 on respective surfaces of the laser diode 120. A heat sink 140 is interposed between the laser diode 120 and a substrate 144, upon which is also mounted the piezoelectric actuator 110. In an alternate embodiment a resonant cavity could also be formed between the rear facet 154 and an output lens (not shown).

Figure 4:
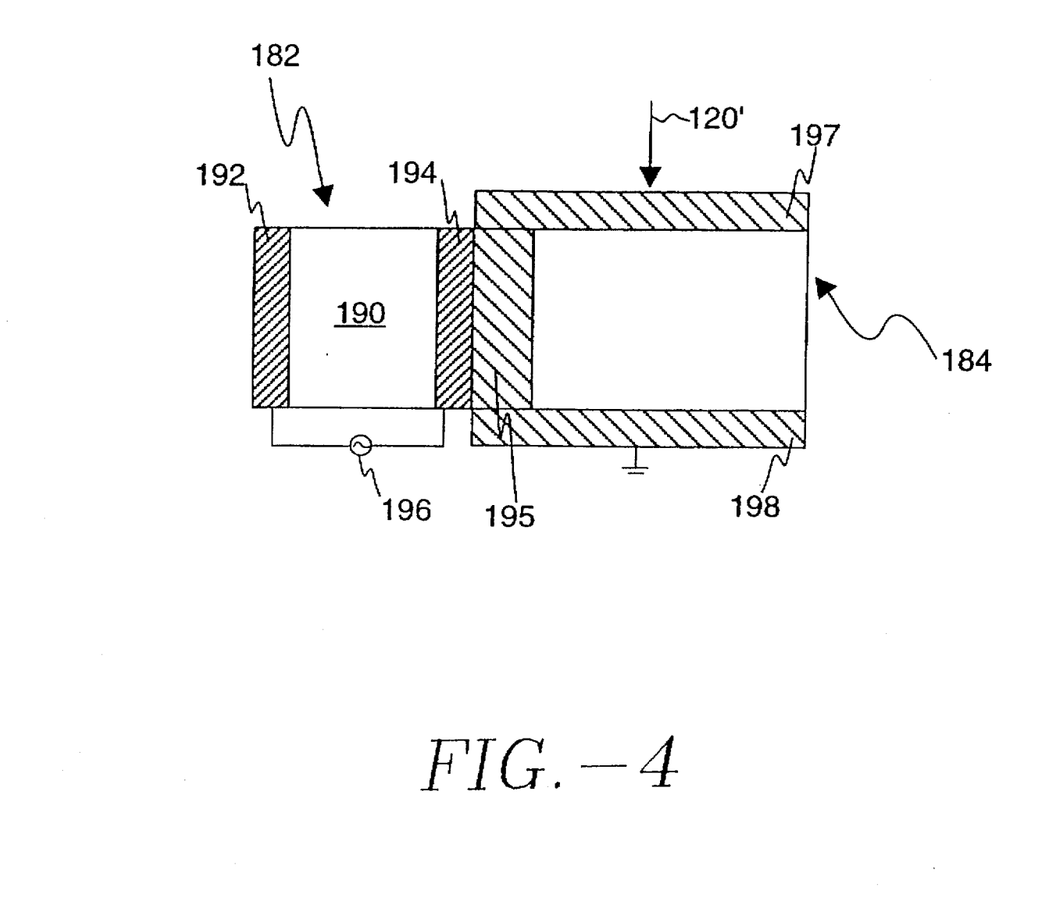
FIG. 4 illustratively represents a monolithic implementation of a high-frequency optical transmitter comprising a thin-film resonator integrated with a diode laser.

FIG. 4 illustratively represents a monolithic implementation of a high-frequency optical transmitter comprising a thin-film resonator 182 integrated with a diode laser 184. The resonator 182 includes a piezoelectric layer 190 sandwiched between high-reflectance and optically transparent metallic coatings 192 and 194, respectively. The thickness of the piezoelectric layer 190 determines the "external" resonant cavity length of the device of FIG. 4. In a preferred embodiment an anti-reflection coating 195 is applied to a front facet of the diode laser 184, which is seen to be immediately adjacent the transparent coating 192. The high-reflectance coating 190 may be realized using a metal such as gold, while tin oxide ($SnO_2$) may be used for the transparent coating. While the coating 190 will typically approximately 90% reflective, it is noted that coatings of up to 99.9% reflectivity are also available.

In accordance with the invention, the thin-film resonator 182 is operative in conjunction with the diode laser 184 to form an optical transmitter capable of providing an amplitude-modulated optical output. In this regard the resonant frequency of the TFR, which is governed by an AC source 195 connected between the metallic coatings 190 and 192, determines the frequency of an optical "carrier" signal produced by the transmitter. The amplitude of this carrier signal may then be modulated by way of corresponding modulation of the bias current 197 conducted through the diode laser 184 through the electrodes 197 and 198.

Figure 5:
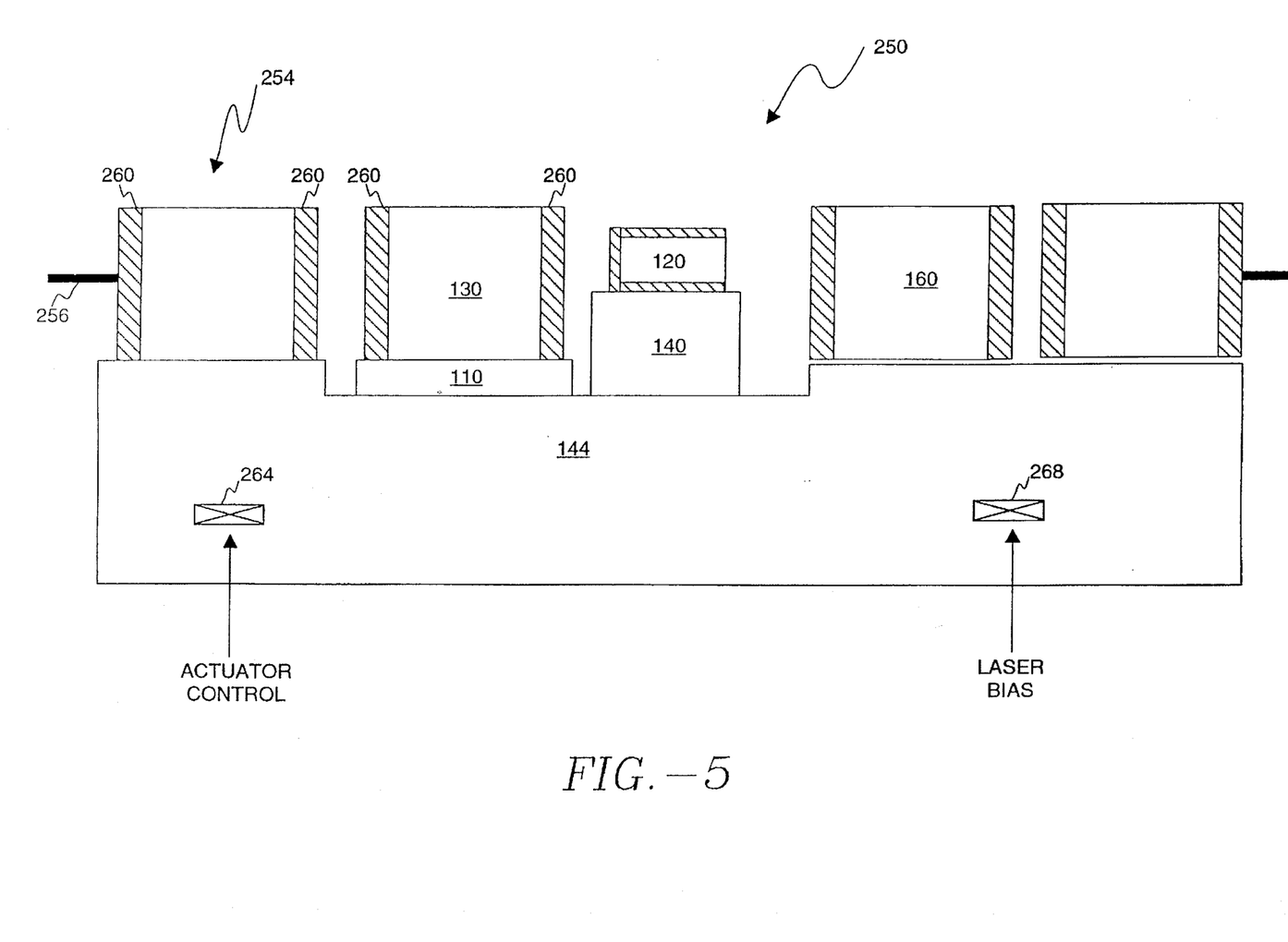
FIG. 5 shows a dual-mode amplifier-oscillator module disposed to be directly integrated within an existing fiber optic communication system.

Turning now to FIG. 5, there is shown a dual-mode amplifier-oscillator module 250 disposed to be directly integrated within an existing fiber optic communication system. Given the similarity between the devices depicted in FIGS. 3 and 5, identical reference numerals have been employed to identify like components. Referring to FIG. 5, the module 250 includes an input rod lens 254 for receiving an optical signal from an optical input fiber 256 of the communication system. Both surfaces of the rod lens 254, as well as the each of the other lens surfaces within the module 250, are coated with a conventional anti-reflection (AR) coating 260.

As was described above with reference to FIG. 3, a piezoelectric actuator 110 operates to modify the length of a resonant cavity external to a semiconductor diode laser 120. This cavity length modification induces a corresponding change in facet reflectivity, which results in a transition between amplification or signal generation modes of operation of the amplifier-oscillator 100.

More specifically, during operation in an amplification mode the input signal coupled from the optical fiber 256 by an input rod lens 254 is applied to the rod lens 130 proximate the front facet of the diode laser 120. In response to a control signal received through connector 264, the piezoelectric actuator 110 positions the rod lens 130 relative to the front facet of laser diode 120 such that the resonant cavity therebetween is of a first predetermined length. Again, the first predetermined cavity length is selected (FIG. 2) to be one which causes a substantial reduction in the effective reflectivity of the front laser facet, thereby suppressing optical oscillation within the laser diode 120 during the amplification mode.

When it is desired to switch to a signal generation (i.e., oscillation) mode, the piezoelectric actuator 110 translates the position of the rod lens such that a resonant cavity of a second predetermined length is created external to the laser diode. This second cavity length effectively increases the reflectivity of the front facet at least to the extent required to induce optical oscillation within the laser diode 120. In the signal generation mode, the optical output may be modulated through modulation of the bias current supplied to the laser diode 120 through connector 268.

In both the amplification and signal generation modes, the optical output from the rod lens 160 is coupled to an optical output fiber 270 through a fiber coupling rod lens 272. In an exemplary embodiment, the input rod lens 254, the rod lens 130 and the output rod lens 160 are implemented using 0.5, 0.25 and 0.23 pitch rod lenses, respectively.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An optical amplifier device for amplifying input light comprising:
   a body of semiconductor material having opposed front and rear facets, said body semiconductor material accepting said light through said front facet and amplifying said light during propagation thereof to said rear facet;
   an optical element having a partially optically reflective surface positioned with the optically reflective surface a predetermined distance from one of said facets, said optical element being positioned such that a resonant optical cavity is formed between said partially optically reflective surface and said one facet; and
   means for applying said input light to said front facet.

2. The amplifier of claim 1 wherein said optical element comprises means for applying said input light to said front facet.

3. The amplifier of claim 2 wherein said optical element comprises an output lens, said output lens having a partially optically reflective surface opposite said rear facet.

4. The amplifier of claim 1 wherein said body of semiconductor material comprises a semiconductor diode laser.

5. The amplifier of claim 4 further including means for pumping said diode laser in order to provide a predetermined level of optical gain.

6. The amplifier of claim 1 wherein said predetermined distance is less than 1 µm.

7. An amplifier as in claim 2 in which said optical element comprises a lens with its front surface being partially optically reflective and facing said front facet.

8. An optical source comprising:
   a semiconductor diode laser having opposed first and second facets;
   an optical element having a partially optically reflective surface positioned a predetermined distance from one of said first and second facets, said optical element being positioned such that a resonant optical cavity is formed between said partially optically reflective surface and said one facet; and
   means for modulating said predetermined distance between said at least partially optically reflective surface and said one facet so as to modulate the amplitude of optical output produced by said semiconductor diode laser.

9. The optical source of claim 8 further including lens means for coupling said optical output from the other one of said first and second facets.

10. The optical source of claim 8 further including lens means for coupling said optical output from said at least one of said first and second facets.

11. The optical source of claim 8 wherein said means for modulating said predetermined distance includes a piezoelectric resonator to which is attached said at least partially optically reflective surface.

12. The optical source of claim 11 wherein said piezoelectric resonator includes a piezoelectric layer sandwiched between a pair of opposing electrodes.

13. The optical source of claim 8 wherein said predetermined distance is less than 1 µm.

14. A dual-mode optical device comprising:
   a body of semiconductor material having opposed front and rear facets, said body of semiconductor material accepting a light input through said front facet and amplifying said light input during operation if said device in an amplification mode;
   an optical element having a partially optically reflective surface;
   means for positioning said optical element with the partially optically reflective surface a first predetermined distance from one of said facets during operation of said device in said amplification mode, and a second predetermined distance from said one of said facets so as to induce optical oscillation within said body of semiconductor material during operation in a signal generation mode; and
   means for applying said light input to said front facet during operation of said device in said amplification mode.

15. The dual-mode optical device of claim 14 further including means for modulating said second predetermined distance between said at least partially optically reflective surface and said one facet so as to modulate amplitude of optical output produced by said body of semiconductor material during said signal generation mode.

16. The dual-mode optical device of claim 14 wherein said optical element comprises said means for applying said light to said front facet.

17. The dual-mode optical device of claim 14 wherein said optical element comprises an output lens having a surface opposing said rear facet upon which is defined said at least partially reflective optically reflective surface.

18. The dual-mode optical device of claim 14 wherein said body of semiconductor material comprises a semiconductor diode laser.

19. The dual-mode optical device of claim 18 further including means for pumping said diode laser in order to provide a predetermined level of optical gain.

20. The dual-mode optical device of claim 14 further including lens means for coupling optical output, produced by said body of semiconductor material during said signal generation mode, from said rear facet.

21. The dual-mode optical device of claim 15 wherein said means for modulating said second predetermined distance includes a piezoelectric resonator to which is attached said at least partially optically reflective surface.

22. The dual-mode optical device of claim 21 wherein said piezoelectric resonator includes a piezoelectric layer sandwiched between a pair of opposing electrodes.

23. The dual-mode optical device of claim 14 wherein said first and second predetermined distances are less than 1 µm.

24. In an optical system including a semiconductor diode laser having opposed first and second facets, a method for providing a source of modulated optical energy comprising the steps of:
   positioning an at least partially optically reflective surface a predetermined distance from one of said first and second facets, thereby forming a resonant cavity between said one facet and said at least partially optically reflective surface; and
   modulating said predetermined distance between said at least partially optically reflective surface and said one facet so as to modulate amplitude of optical output produced by said semiconductor diode laser.

25. The method of claim 24 further including the step of coupling said optical output from the other one of said first and second facets.

26. In an optical system including a semiconductor diode laser having opposed front and rear facets, a method for providing a source of modulated optical energy during operation of said laser in a signal generation mode and for amplifying light input during operation of said laser in an amplification mode, said method comprising the steps of:

applying said light input to said front facet during operation in said amplification mode;

amplifying said light input within said laser during operation in said amplification mode;

positioning an at least partially optically reflective surface a first predetermined distance from one of said front and rear facets during operation of said device in said amplification mode, and positioning said at least partially optically reflective surface a second predetermined distance from said one of said front and rear facets during operation in a signal generation mode so as to induce optical oscillation within said body of semiconductor material.

27. The method of claim 26 further including the step of modulating said second predetermined distance between said at least partially optically reflective surface and said one of said front and rear facets so as to modulate amplitude of optical output produced by said semiconductor diode laser during said signal generation mode.

* * * * *